(12) United States Patent
Bondestam et al.

(10) Patent No.: US 6,579,374 B2
(45) Date of Patent: Jun. 17, 2003

(54) APPARATUS FOR FABRICATION OF THIN FILMS

(75) Inventors: Niklas Bondestam, Helsinki (FI); Janne Kesälä, Espoo (FI); Leif Keto, Kauniainen (FI); Pekka T. Soininen, Helsinki (FI)

(73) Assignee: ASM Microchemistry Oy, Espoo (FI)

( * ) Notice: Subject to any disclaimer, the term of this patent is extended or adjusted under 35 U.S.C. 154(b) by 0 days.

(21) Appl. No.: 09/769,562

(22) Filed: Jan. 25, 2001

(65) Prior Publication Data

US 2001/0009140 A1 Jul. 26, 2001

Related U.S. Application Data

(63) Continuation of application No. 09/568,077, filed on May 10, 2000.

(30) Foreign Application Priority Data

May 10, 1999 (FI) .................................................. 991078

(51) Int. Cl.[7] .............................................. C23C 16/00
(52) U.S. Cl. ....................... 118/725; 118/724; 118/715
(58) Field of Search ................................ 118/715, 725, 118/724; 156/345.37, 345.52

(56) References Cited

U.S. PATENT DOCUMENTS

| | | | |
|---|---|---|---|
| 4,058,430 A | 11/1977 | Suntola et al. | |
| 4,222,576 A | 9/1980 | Clements | |
| 4,389,973 A | 6/1983 | Suntola et al. | |
| 4,413,022 A | 11/1983 | Suntola et al. | |
| 4,747,367 A | 5/1988 | Posa | |
| 4,761,269 A | 8/1988 | Conger et al. | |
| 4,836,138 A | 6/1989 | Robinson et al. | 118/666 |
| 4,889,319 A | 12/1989 | Phillips et al. | |
| 4,993,357 A | 2/1991 | Scholz | |
| 5,071,670 A | 12/1991 | Kelly | |
| 5,281,274 A | 1/1994 | Yoder | |
| 5,294,572 A | 3/1994 | Granneman et al. | 437/225 |

(List continued on next page.)

FOREIGN PATENT DOCUMENTS

| | | |
|---|---|---|
| EP | 1 069 599 A2 | 1/2001 |
| WO | WO 96/17107 | 6/1996 |
| WO | WO 00/40772 | 7/2000 |
| WO | WO 00/47404 | 8/2000 |

OTHER PUBLICATIONS

K. Kukli et al., "Influence of atomic layer deposition parameters on the phase content of $Ta_2O_5$ films," *Journal of Cyrstal Growth*, vol. 212, pp. 459–468 (2000).

(List continued on next page.)

*Primary Examiner*—Thi Dang
(74) *Attorney, Agent, or Firm*—Knobbe, Martens, Olson & Bear, LLP.

(57) ABSTRACT

The invention relates to an apparatus for growing thin films onto a substrate by exposing the substrate to alternate surface reactions of vapor-phase reactants for forming a thin film onto the substrate by means of said surface reactions. The apparatus comprises a vacuum vessel (1), a reaction chamber (2) with a reaction space into which the substrate can be transferred and which has infeed channels (6) for feeding therein the reactants used in said thin film growth process, as well as outlet channels (4) for discharging gaseous reaction products and excess reactants. According to the invention, said reaction chamber comprises a base part (9, 10) mounted stationary in respect to the interior of said vacuum vessel (1) and a movable part (18) adapted to be sealably closable against said base part of said reaction chamber. The invention makes it possible to improve the cleanliness of the substrate load chamber and to reduce the degree of substrate contamination. The apparatus is intended for use in the fabrication of thin films by means of the ALE method for semiconductor layer structures and display units.

75 Claims, 3 Drawing Sheets

U.S. PATENT DOCUMENTS

| | | | |
|---|---|---|---|
| 5,306,666 | A | 4/1994 | Izumi |
| 5,314,574 | A | 5/1994 | Takahashi |
| 5,520,743 | A | 5/1996 | Takahashi |
| 5,709,757 | A | 1/1998 | Hatano et al. |
| 5,711,811 | A | 1/1998 | Suntola et al. |
| 5,769,950 | A | 6/1998 | Takasu et al. |
| 5,785,796 | A * | 7/1998 | Lee ............................ 118/715 |
| 5,855,680 | A | 1/1999 | Soininen et al. |
| 5,879,415 | A | 3/1999 | Shimada .................... 29/25.01 |
| 5,885,353 | A | 3/1999 | Strodtbeck et al. |
| 5,891,251 | A | 4/1999 | MacLeish et al. |
| 5,916,365 | A | 6/1999 | Sherman |
| 6,015,590 | A | 1/2000 | Suntola et al. |
| 6,042,652 | A | 3/2000 | Hyun et al. |
| 6,054,688 | A | 4/2000 | Moschini |
| 6,120,609 | A | 9/2000 | Selyutin et al. |
| 6,125,859 | A | 10/2000 | Kao et al. |
| 6,143,077 | A * | 11/2000 | Ikeda et al. ................. 118/715 |
| 6,167,834 | B1 | 1/2001 | Wang et al. ............. 118/723 E |
| 6,174,377 | B1 | 1/2001 | Doering et al. |
| 6,306,216 | B1 | 10/2001 | Kim et al. |
| 6,350,319 | B1 | 2/2002 | Curtis et al. |
| 2001/0035127 | A1 | 11/2001 | Metzner et al. |

OTHER PUBLICATIONS

M. Putkonen, "Surface–controlled growth of magnesium oxide thin films by atomic layer epitaxy," *Journal of Materials Chemistry*, vol. 9, pp. 2449–2452 (1999).

J. Rautanen et al., "The effect of growth parameters on the deposition of CaS thin films by atomic layer epitaxy," *Applied Surface Science*, vols. 82/83, pp. 553–558 (1994).

H. Viirola et al., "Controlled growth of tin dioxide thin film by atomic layer epitaxy," *Thin Solid Films*, vol. 249, pp. 144–149 (1994).

Markku Ylilammi et al., "Luku VII Ohutkalvotekniikka," *Tyhjiötekniikka*, pp. 253–261 (1986).

Tuomo Suntola, "Atomic Layer Epitaxy," *Handbook of Crystal Growth 3. Thin Films and Epitaxy. PartB: Growth Mechanims and Dynamics*, pp. 601–663, D.T.J. Hurle, Ed., Elsevier (1994).

Abeles, B. et al, Physical Review Letters, vol. 51, No. 21, pp. 2003–2006, "Amorphous Semiconductor Superlattices", Nov. 1983.

Hiltunen, L. et al., Thin Solid Films, vol. 166 (1988), pp. 149–154, "Nitrides of Titanium, Niobium, Tantalum and Molybdenum Grown as Thin Films by the Atomic Layer Epitaxy Method", Apr. 1988.

Suntola, T., Materials Science Reports 4 (1989), pp. 261–312, "Atomic Layer Epitaxy", Feb. 1989.

Horiike, Y. et al, Applied Surface Science, vol. 46 (1990), pp. 168–174, "Filling of Si Oxide into a Deep Trench Using Digital CVD Method", Jul. 1990.

Sakaue, H et al., Japanese Journal of Applied Physics, vol. 30, No. 1B, pp. 124–127, "Digital Chemical Vapor Deposition of $SiO_2$ Using a Repetitive Reaction of Triethylsilane/Hydrogen and Oxidation", Jan. 1990.

Suntola, T., Thin Solid Films, vol. 216 (1992), pp. 84–89, "Atomic Layer Epitaxy", 1992.

Wise, M. et al., Materials Research Society, vol. 334, pp. 37–43, "Diethyldiethoxysilane as a New Precursor for $SiO_2$ Growth on Silicon", 1994.

Kaizuka, T. et al., Jpn. J. Appl. Phys, vol. 33 (1994), pp. 470–474, "Conformal Chemical Vapor Deposition TiN (111)Film Formation as an Underlayer of Al for Highly Reliable Interconnects", Jan. 1994.

Sneh, O. et al., Surface Science, vol. 334 (1995), pp. 135–152, "Atomic Layer Growth of $SiO_2$ on $Si(100)$ Using $SiCl_4$ and $H_2O$ in a Binary Reaction Sequence" 1995.

Kukli, K. et al., J. Electrochem. Soc., vol. 142, No. 5, pp. 1670–1674, "Atomic Layer Epitaxy Growth of Tantalum Oxide Thin Films from $Ta(OC_2H_5)_5$ and $H_2O$", May 1995.

Leskela, M. et al., Journal de Physique IV, vol. 5, pp. 937–951, "Atomic Layer Epitaxy in Deposition of Various Oxide and Nitride Thin Films", Jun. 1995.

Niinisto, L. et al, Materials Science and Engineering, vol. B41 (1996), pp. 23–29, "Synthesis of Oxide Thin Films and Overlayers by Atomic Layer Epitaxy for Advanced Applications", 1996.

Ducso, C. et al., J. Electrochem. Soc., vol. 142, starting at p. 683, "Deposition of Tin Oxide into Porous Silicon by Atomic Layer Epitaxy", Feb. 1996.

Min, J. et al, Mat.Res. Soc. Symp Proc., vol. 514, starting at p. 337, "Atomic Layer Deposition of TiN Thin Films by Sequential Introduction of Ti Precursor and $NH_3$", 1998.

Ritala, J., M. Electrochem. Soc., vol. 145, No. 8, pp. 2914–2920, "Atomic Layer Epitaxy Growth of TiN Thin Films from $TiI_4$ and $NH_3$", Aug. 1998.

Min, J. et al., Jpn. J. Appl. Phys., vol. 37 (1998), pp. 4999–5004, Atomic Layer Deposition of TiN by Alternate supply of Tetrakis(ethylmethylamino)–Titanium and Ammonia, Sep. 1998.

Ritala, M. et al., Chemical Vapor Deposition, vol. 5, No. 1, pp. 7–9, "Perfectly Conformal TiN and $Al_2O_3$ Films Deposited by Atomic Layer Deposition", 1999.

Martensson, P. et al., J. Vac. Sci. Technol., vol. B 17 (5), pp. 2122–2128, "Use of Atomic Layer Epitaxy for Fabrication of Si/TiN/Cu Structures", Sep./Oct. 1999.

* cited by examiner

APPARATUS FOR FABRICATION OF THIN FILMS

REFERENCE TO RELATED APPLICATION

The present application is a continuation of U.S. application Ser. No. 09/568,077, filed May 10, 2000, which claims the foreign priority benefit under 35 U.S.C. §119 of Finnish Application No. FI 991078, filed May 10, 1999.

FIELD OF THE INVENTION

The present invention relates to an apparatus according to the preamble of claim I for fabrication of thin films.

BACKGROUND OF THE INVENTION

In an apparatus disclosed herein, a substrate placed in a reaction space is subjected to alternate surface reactions of at least two different reactants suitable for fabricating a thin film. The vapor-phase reactants are fed in a repetitive and alternating manner each at a time from its own supply into a reaction space, wherein they are brought to react with the surface of a substrate in order to produce a solid-state thin film product on the substrate. Reaction products not adhering to the substrate and possible excess reactants are removed in gas phase from the reaction space.

Conventionally, thin films are grown out using vacuum evaporation deposition, Molecular Beam Epitaxy (MBE) and other similar vacuum deposition techniques, different variants of Chemical Vapor Deposition (CVD)(including low-pressure and metallo-organic CVD and plasma-enhanced CVD) or, alternatively, the above-mentioned deposition process based on alternate surface reactions, known in the art as the Atomic Layer Epitaxy, shortly ALE, or Atomic Layer Deposition, (ALO). In this description, the term "ALE" will be used, In the MBE and CVD processes, besides other variables, the thin film growth rate is also affected by the concentrations of the starting material inflows. To achieve a uniform surface smoothness of the thin films manufactured using these methods, the concentrations and reactivities of the starting materials must be kept equal on one side of the substrate. If the different starting materials are allowed to mix with each other prior to reaching the substrate surface as is the case in the CVD method, the possibility of mutual reactions between the reagents is always imminent. Herein arises a risk of microparticle formation already in the infeed lines of the gaseous reactants. Such microparticles generally have a deteriorating effect on the quality of the deposited thin film. However, the occurrence of premature reactions in MBE and CVD reactors can be avoided, e.g., by heating the reactants not earlier than or only at the substrates. In addition to heating, the desired reaction can be initiated with the help of, e.g., plasma or other similar activating means.

In MBE and CVD processes, the growth rate of thin films is primarily adjusted by controlling the inflow rates of starting materials impinging on the substrate. By contrast, the thin film growth rate in the ALE process is controlled by the substrate surface properties, rather than by the concentrations or other qualities of the starting material inflows. In the ALE process, the only prerequisite is that the starting material is provided in a sufficient concentration for film growth on the substrate.

The ALE method is described, e.g., in FI Pat. Nos. 52,359 and 57,975 as well as in U.S. Pat. Nos. 4,058,430 and 4,389,973. Also in FI Patents Nos. 97,730, 97,73 and 100,409 are disclosed some apparatus constructions suited for implementing the method. Equipment for thin film deposition are further described in publications Material Science Report 4(7), 1989, p. 261, and Tyhjiötekniikka (title in English: Vacuum Techniques), ISBN 951-794-422-5, pp. 253–261.

In the ALE deposition method, atoms or molecules sweep over the substrates thus continuously impinging on their surface so that a fully saturated molecular layer is formed thereon. According to the conventional techniques known from FI Patent Specification No. 57,975, the saturation step is followed by a protective gas pulse forming a diffusion barrier that sweeps away the excess starting material and the gaseous reaction products from the substrate. The successive pulses of different starting materials and the protective gas pulses forming diffusion barriers that separate the successive starting materials pulses from each other accomplish the growth of the thin film at a rate controlled by the surface chemistry properties of the different materials. To the function of the process it is irrelevant whether they are the gases or the substrates that are kept in motion, but rather, it is imperative that the different starting materials of the successive reaction steps are separated from each other and arranged to impinge on the substrate alternately.

Most vacuum evaporators operate on the so-called "single-shot" principle hereby, a vaporized atom or molecule can impinge on the substrate only once. If no reaction with the substrate surface occurs, the atom or molecule is rebound or re-vaporized so as to hit the apparatus walls or the vacuum pump undergoing condensation therein. In hot-wall reactors, an atom or molecule impinging on the reactor wall or the substrate may become re-vaporized and thus undergoing repeated impingements on the substrate surface. When applied to ALE reactors, this "multi-shot" principle can offer a number of benefits including improved efficiency of material consumption.

In practice, the "multi-shot" type ALE reactors are provided with a reactor chamber structure comprised of a plurality of adjacently or superimposedly stacked modular elements of which at least some are identical to each other and by milling, for instance, have reaction chambers made thereto with suitable cutouts and openings serving as the inlet and outlet channels. Alternatively, the substrates can be placed in an exposed manner in the interior of the vacuum vessel acting as the reaction space. In both arrangements, the reactor must be pressurized in conjunction with the substrate load/unload step.

In the fabrication of thin-film structures, it is conventional that the reactors are preferably run under constant process conditions stabilized in respect to the process temperature, operating pressure as well as for other process parameters. The goal herein is to prevent the attack of foreign particles and chemical impurities from the environment on the substrates and to avoid thermal cycling of the reactors that is a time-consuming step and may deteriorate the process reliability. In practice, these problems are overcome by using a separate substrate load/transfer chamber. The substrate loading chamber communicates with the reactors and is kept under a constant vacuum. The load and unload steps of the substrates are performed so that both the reactor and the loading chamber are taken to a vacuum, after which the valve (such as a gate valve) separating the two from each other is opened, whereby a robotic arm constructed into the loading chamber removes a processed substrate from the reaction chamber and loads a new substrate. Subsequently, the valve is closed and the process may start after the substrate and the reactor have attained their nominal process values. On the other side, the processed substrate is transferred via another controllable valve from the loading chamber to a vacuumized load lock, after which the load lock valve is closed. Next, the load lock may be pressurized, after which the substrate can be removed from the equipment via a third valve opening into the room space. Respectively, the next substrate to be processed can be transferred via the loading chamber into the reactor.

In conventional constructions, the substrate is placed on a heater so that the robotic arm can move the substrate to a desired point in the interior of the reactor, after which the substrate is elevated typically with the help of three pins directly upward for the duration of the robotic arm withdrawal. Next, the substrate is lowered onto a heatable susceptor platform by lowering said pins below the surface level of said susceptor, whereby the substrate remains resting in a good thermal contact with the susceptor.

In the above-described types of reactors, the gas flow enters the reaction space via a "shower head" located above the substrate so as to distribute the gas over the hot substrate, whereby the desired surface reaction can take place and form a desired type of thin-film layer on the substrate surface. If used in an ALE-reactor, however, this type of infeed technique would require that, at the beginning and end of each reactant infeed pulse, a period of a duration generally equal to that of the reactant pulse length would become indispensable in order to allow for the homogenization of the gas concentration and flush-out of the previous gas pulse. In practice, this would lead to the mixing of the reactant vapors with each other, whereby the ALE mode of film growth would actually turn into a CVD process. By the same token, the process is hampered by a slow throughput, poor material utilization efficiency and/or large thickness variations.

Furthermore, the walls of the vacuum vessel would respectively become covered with condensed layers of starting materials, and the consequences particularly in conjunction with the use of solid-state sources would be the same as those discussed above.

The reason for running the ALE process in a batch mode is because the ALE method is relatively slow as compared with many other types of thin-film growth techniques. Batch processing, however is capable of bringing the total growth time per substrate to a competitive level. For the same goal, also the substrate sizes have been made larger.

The ALE method also can be utilized for depositing composite layer structures, whereby a single run can be employed for making a plurality of different film structures in a single batch. Thus, also the processing time per fabricated unit can be reduced.

The large stack assemblies required in batch processes are typically put together in some auxiliary space, after which they must be transferred as compact units into the interior of the opened reactor. Typically, the bake-out heating of the reactor chamber structures takes a few hours (1–4 h) followed by the processing step (taking about 2–4 h to a thickness of 300 nm $Al_2O_3$), and the cooling lasts up to tens of hours depending on the size of the reactor construction. Furthermore, a certain time must be counted for the dismantling and reassembly of the reactor chamber.

The proportion of the processing time to the work time required by the other processing steps becomes the more disadvantageous the thinner are the thin films (e.g., in the range 1–50 nm) to be grown, whereby the duration of the actual deposition step may last from one to several minutes only. Then, an overwhelming portion of the total processing time in respect to actual processing time is used for heating/cooling the reactor chamber structure, pressurization of the reactor, dismantling/reassembly of the reactor chamber, bringing the system to vacuum and reheating the same.

SUMMARY OF THE INVENTION

It is an object of the present invention to overcome the drawbacks of the prior-art technology and to provide an entirely novel apparatus for growing thin films of homogeneous quality using the ALE method in a commercial scale. It is a particular object of the invention to provide an apparatus construction suitable for fabricating very thin films under such circumstances in which the reactor and the structure forming the reactor chamber are all the time kept under stabilized process conditions, whereby the heating, pressurizing and vacuum pumping cycles are performed in respect Lo the substrates alone. It is a further object to provide a reactor design that allows single wafer processing, using the advantages of the previous ALE reactors, viz. minimal reaction volume, aerodynamic design for smooth passing of pulses without (dead volumes.

The goal of the invention is achieved by virtue of a novel concept in which the benefits of a reactor chamber structure and those of a cold-wall ALE reactor are combined with those of reactor equipped with an internal loading chamber through designing reaction chamber construction such that can be opened and closed in the interior of the reactor for the substrate load/unload steps. The reactor volume is so small that there is not enough space for wafer handling. Therefore, the reaction chamber needs to be opened, not by a valve but by taking parts of the reactor apart, for wafer transfer. To prevent exposure of the reaction chamber to the ambient, a second chamber is built around the reaction chamber.

Accordingly, the reaction chamber construction according to the invention comprises at least one part movable with respect to the remaining part of the reaction chamber and adapted to be sealably closable against said remaining part of the reaction chamber such that a substrate can be loaded/unloaded into and out of the reaction chamber. According to one embodiment which will be described in more detail below, the reactor chamber comprises at least two basic parts, namely a stationary base part of the reactor structure and a movable part of said structure, the latter being adapted to be sealably closable against said base part, whereby the reaction space remaining between said base part and said movable part attains the characteristic shape required from such a volume. One combination element formed by the base part and the movable part of the reaction chamber structure acts as a substrate support platform, or base, on which a substrate can be positioned by means of a robotic arm or by the movements of a given part of said arm. However, the basic idea is to have reactor chamber parts which are movable with respect to each other. e.g. one horizontally, the other vertically, or both vertically.

The invention offers significant benefits. Accordingly, the construction according to the invention counteracts to the contamination of the intermediary spaces of the reactor, whereby also the cleanliness of the loading chamber is improved, the contamination risk of substrates reduced and the base pressure can be pumped down at a faster rate. The commercial processing of single substrates facilitated by the apparatus according to the invention offers the further benefit that each substrate can be processed in a tailored manner if so desired. Moreover, the ALE process need not anymore be run in a batch mode if the other production units are operated in a continuous mode.

The apparatus according to the invention is also applicable to the fabrication of different types of thin films including those of the semiconductor variety, as well as thin-film structures of display units by means of the ALE method.

BRIEF DESCRIPTION OF THE DRAWINGS

In the following, the invention will be elucidated with the help of a detailed description. A preferred embodiment of the invention is illustrated in the appended drawings in which.

DETAILED DESCRIPTION OF THE PREFERRED EMBODIMENTS

In the context of the present invention, the term "reactant" refers to a vaporizable material capable of reacting with the substrate surface. The reactants may be solids, liquids or gases. In the ALE method, reactants belonging to two different groups are conventionally employed. The term "metallic reactants" is used of metallic compounds or even elemental metals. Suitable metallic reactions are the halogenides of metals including chlorides and bromides, for instance, and metal or such as the thd complex compounds. As examples of metallic reactants Zn, $ZnCl_2$, $TiCl_4$, $Ca(thd)_2$, $(CH_3)_3Al$ and $Cp_2Mg$ may be mentioned. The term "nonmetallic reactants" refers to compounds and elements capable of reacting with metallic compounds. The latter group is typically represented by water, sulfur, hydrogen sulfide and ammonia.

In the present context, the term "protective gas" gas is used to refer to a gas which is admitted into the reaction space and is capable of preventing undesired reactions related to the reactants and, correspondingly, the substrate. Such reactions include e.g. the reactions of the reactants and the substrate with possible impurities. The protective gas also serves to prevent reactions between substances of different reactant groups in, e.g., the inflow lines. In the method according to the invention, the protective gas is also advantageously used as the carrier gas of the vapor-phase pulses of the reactants. According to a preferred embodiment, in which reactants of different reactant groups are admitted via separate inlet manifolds into the reaction space, the vapor-phase reactant pulse is admitted from one inflow channel while the protective gas is admitted from another inflow channel thus preventing the admitted reactant from entering an inflow channel serving another reactant group. Of protective gases suited for use in the method, reference is made to inert gases such as nitrogen gas and noble gases, e.g., argon. The protective gas may also be an inherently reactive gas such as hydrogen gas serving to prevent undesirable reactions (e.g., oxidization reactions) from occurring on the substrate surface.

According to the invention, the term "reaction space" includes both that part of the reaction chamber in which the substrate is located and in which the vapor-phase reactants are allowed to react with the substrate in order to grow thin films as well as the gas inflow/outflow channels communicating immediately with the reaction chamber, said channels serving for admitting the reactants into the reaction chamber (via inflow channels) or removing the gaseous reaction products of the thin-film growth process and excess reactants from the reaction chamber (via outflow channels). According to the construction of ihe embodiment, the number of the inflow and outflow channels, respectively, can be varied from one upward. They may also be located at opposite ends of the substrates whereby the outflow orifice corresponding to each reactant group is located at the end of the inflow manifold of the other group, advantageously separated therefrom by means of a gas separating plate. The gases may also be fed onto the substrate alternately from opposite directions. In this manner it is possible to compensate any observed stronger film growth at the inflow end of the substrate. Also the exhaust suction from the outflow channel in such an arrangement must take place in an alternated manner.

The gas feed inlet openings can be arranged along a curved line, e.g. along a line having a radius of curvature somewhat greater than the radius of the circular substrate to be treated. By means of this arrangement it is possible to obtain an even gas front long the substrate.

Herein, the term "substrate surface" is used to denote that top surface of the substrate onto which the vapor-phase reactant flowing into the reaction chamber primarily impinges. In practice, said surface, during the first cycle of the thin-film growing process is constituted by the surface of the substrate such as glass or silicon wafer, for instance; during the second cycle the surface is constituted by the layer formed during the first cycle and comprising the solid-state reaction product which is deposited by the reaction between the reactants and is adhered to the substrate, etc.

According to the invention, the reactor chamber is fitted within an air-and gas-tight containment, such as a vacuum vessel. Such a reaction chamber comprises e.g. at least two parts, at least one of which is movable with respect to the remaining part of the reaction chamber and adapted to be sealably closable against said remaining part of the reaction chamber such that a substrate can be loaded and unloaded into and out of the reaction chamber. The parts can be moved with respect to each other (one or both); one horizontally (perpedicularly to the lateral plane of the substrate), the other vertically (laterally); or both vertically (laterally). The parts of the reaction chamber are contained in a second chamber, which preferably comprises a vacuum vessel, both during processing and during loading and unloading of a substrate. Thus, there is arranged a double-containment of the substrate.

According to a preferred embodiment, the reaction chamber comprises two parts, one of which being mounted stationary in respect to said vacuum vessel, while the other is designed movable. The transfer of the movable part can take place laterally, that is, parallel to the substrate plane, or alternatively, in a direction perpendicular to the plane of the stationary base part (and thus, to the plane of the substrate). The transfer motion may also occur in both a lateral and a perpendicular direction. The substrate can be adapted mountable on the movable part or on the stationary base part or, in some cases, even on both parts.

In an embodiment in which the movable part is designed such that can be transferred at right angles toward the stationary base part, the stationary part is equipped with a rabbet encircling its edge, while the movable part is provided with an outer edge that is shaped conforming to the rabbet shape in order to provide a seal against the stationary base part.

The construction according to the invention can be implemented in the form of some particularly advantageous embodiments. Accordingly, in the first preferred embodiment of the invention, the reactor chamber is located in the manner disclosed in FI Patent No. 97,730 in the interior of a cold-wall vacuum reactor. In the present context, the term "cold-wall" reactor is used for making reference to an apparatus in which the reaction space and a possible reagent source adapted inside the vacuum vessel are heated each separately. The heating system can be implemented by enclosing each unit of the apparatus within a cover having one side facing the reactor (or source) equipped with a first temperature-equalizing jacket or plate and the other side facing the vacuum vessel wall possibly with another temperature-equalizing jacket or plate. Accordingly, there is adapted between said first and said second jacket a heating means suitable for heating the surfaces of said temperature-equalizing jackets. Such a heating means may comprise tubular resistive elements or planar heaters. The envelopes of the covers enclosing the reaction space and the material sources are most advantageously made from a metal such as stainless steel, titanium or aluminum, or a suitable metal alloy or even a pure metal. By virtue of such an insulation adapted between the reaction space and the reactant sources so as to keep them thermally insulated from each other and from the vacuum vessel the internal temperature of the vacuum vessel can be controlled independently from the temperatures of the sources and the reaction space. Resultingly, the vacuum vessel temperature can be maintained essentially lower than that of the reaction space. As will be evident from the following description of an exemplifying embodiment, a cold-wall reactor may also be constructed without any need to adapt the reagent sources to the interior of the vacuum vessel.

Depending on the type of reaction to be run, the cold-wall vacuum vessel may be replaced by some other type of gastight vessel. This is particularly true for a situation in which the reaction temperature is below about 200° C. In the context of the present invention, the structure discussed herein is called generally with the name "pressure-tight vessel" or "vacuum vessel", said term also including so-called "vacuum vessels". While the growth of a thin film can be carried out under an atmospheric pressure or even a slight overpressure, operation under a partial vacuum will provide certain benefits in respect to the purity of reactant and purge gases, among other things.

Most advantageously, the base part of the reactor chamber is supported to the walls of the vacuum vessel so that the center axis of the support means is coincident with the center point of the substrate. This arrangement prevents mechanical deformations of thermal origin from affecting the extremely critical positioning of the substrate when the reactor chamber is being closed. In order to minimize the effect of thermally induced movements, it is also advantageous to pass the reactant infeed channels and the reaction product discharge channels via (a single and) the same wall of the pressure-tight vessel. When the movable part comprises a vertically movable plate transferred supported by a transport rod, said rod is advantageously extended to the exterior of the vacuum vessel through the same wall as is penetrated by the gas channels. The transport rod can be made movable by manual or actuator-driven means.

The effect of thermal expansion forces on the positioning arrangement can be eliminated with the help of flexible lines, for instance.

Furthermore, the base part may be made to comprise a portion of the vacuum vessel wall.

According to another preferred embodiment of the invention, the stationary base part of the reactor and/or its movable part is provided with heating means, whereby their insulation can be accomplished as needed by means of, e.g., reflective shields or active thermal insulation elements. In respect to the details of such heating means, reflective shields and active thermal insulation elements, reference is made to cited FI Patent No. 97.730. However, it is herein appropriate to mention that means generally called "active thermal insulation elements" typically include a cooling means and a reflective shield. Thus, it is possible to establish between two hot spots a zone cooled to a temperature even lower than the cooler one of said hot spots. Typically, there are adapted thermal radiation reflecting envelopes about the heating means, whereby the number of the envelopes is at least one, but also a greater number of envelopes may be used in concentrically enclosing fashion. The sources are further surrounded by a cooling means, thus accomplishing the above-described cooled zone. This is necessary in the case that the sources are adapted to the interior of the vacuum vessel. The cooling system may be based on a water circulation, for instance. A similar cooling system may be constructed on the wall of the vacuum vessel, too.

The sealing of the movable part (that is, the sealing of the reaction chamber structure) can be accomplished by means of, e.g., an elastomer seal if possible within the constraints of the process and the temperatures involved. Otherwise, the sealing must be made using, e.g., a vacuum pump-out groove seal construction. The sealing effect of the vacuum pump-out groove may be augmented by feeding a protective gas into the groove. This type of vacuum pump-out groove seal can be implemented by, e.g., machining on the surface of the planar structural elements of the chamber, close to the plate edges, a groove shaped as a loop passing close to the edge contour of the plate, thus being capable of sucking away any leaks. The vacuum pump-out groove is connected to a discharge channel which is kept under a vacuum. The vacuum pump-out groove serves to prevent the access of contamination from the exterior of the reactor into the reaction space or, conversely, the entering reactants from escaping to the exterior side of the reaction space. The sealing flow passing in the vacuum pump-out groove provides a maximally effective function if the heaviest constriction to the flow of gases is arranged in the vicinity of the trailing end of the substrate, close to the vacuum suction channel.

Advantageously, the edges of the opposedly mating parts of the reaction chamber are provided with notches cut at right angles to the plane of the plate so as to extend through the plate, thus forming the gas channels of the reaction space when the reaction chamber structure is fully closed.

The reaction chamber can be shaped to accommodate a plurality of substrates. Accordingly, the reaction chamber may be provided with support structures on which at least two substrates can be placed for depositing thin-film structures on both substrates simultaneously. Generally, such support structures may comprise a rack having platform shelves or brackets provided thereon for supporting the substrates, or alternatively, a cassette unit consisting of stackable, preferably mutually identical, modular elements, whereby the interior spaces of at least a part of the stackable elements are shaped so that they will be able to accomodate the substrates. Preferably these elements are provided support brackets or platforms for the substrates. The support structures may be placed on the stationary base part of the reactor or, alternatively, on a movable base plate.

The racks may have either an open or a closed structure. In an open rack, the sides are left open so as to give a free access for the reactant gases from the infeed channel to the substrates and, conversely, from the substrates to the discharge channel. In a closed rack, the sides are partially closed, whereby the flow of the reactant gases takes place via infeed openings provided at one side of the rack, close to the substrates, while the other side is respectively equipped with a discharge opening. Such a rack construction is provided with substrate holders comprised of shelf platforms or brackets serving to support the substrates. The latter arrangement also facilitates two-sided deposition on the substrates. If the substrate support is provided by shelf platforms, they can be equipped with heating means serving to stabilize the reaction temperature.

Instead of having a shelf construction, the reaction chamber may be composed of essentially similar (even identical) modular elements stacked on a base plate, whereby the proper design of the stack elements have indents and grooves made thereto such that narrow passageways are formed acting as flow constrictors to the gas flowing through the reaction space. The elements have recesses made thereto with surfaces acting as substrate supports. The components of such a stackable cassette pack structure are fabricated from a material that is resistant to the reactants used in the ALE growth process. In this respect, advantageous materials are glass and the like silicate-based compositions, as well as various ceramics. The same groups of materials, as well as various metal alloys, are also suitable for making the racks.

When required, the internal surfaces of the process equipment may be passivated by depositing thereon, e.g., an $Al_2O_3$ layer that can be formed using ALE from suitable starting materials such as aluminum chloride and water.

For multiple substrate processing applications, the inlet and outlet lines (or feeding/pumping lines) of the reactant gases are advantageously connected in a permanent manner to the reaction chamber. Further, the substrate rack or cassette structure is advantageously arranged in the reaction chamber so that the end of the gas discharge channel meets the gas discharge opening of the rack or cassette structure as tightly as possible. The substrates may also be arranged in an essentially upright position in the reaction space.

According to a third preferred embodiment of the invention, the movable part is equipped with a substrate lift means. Whose upright movement facilitates easy placement of the substrate onto the robotic arm. Such substrate lift means can comprise, e.g., pins inserted in holes made on the substrate support surface so as to force the pegs to move at right angles in respect to the support surface. The pins may be spring-loaded, whereby they automatically can lift the substrate upward off from the substrate support surface when the stacked pack is opened. The top ends of the pins are shaped downward tapering. Also the holes of the support surface are shaped similarly downward tapering, thus causing the downward conical pin head to seal automatically against the hole seat when the substrate is placed in the reaction space. This arrangement serves to achieve a maximum tightness in order to prevent the reactants from leaking freely into the reaction chamber. Otherwise, the reactants contained in the reaction chamber could repenter the reaction space at an incorrect time thereby interfering with action of the subsequent reactant pulses. Moreover, the reactants are often of a corrosive nature and their access to the loading chamber side would be detrimental to the process.

To overcome the sealing problems, one starting material group can be introduced into the reaction space via its top side and the other via its bottom side. It must be noted herein that the movement of the movable part may also be arranged so as to occur in the principal plane, that is, in the lateral direction. Herein, the movable part (such as a cover) is transferred by means of a pushing movement of the robotic arm.

Advantageously, also the gas inlet and outlet Lines are sealed in respect to the intermediary space. Typically, the load/transfer chamber is taken to a vacuum from about $10^{-6}$ bar to 10 mbar and, respectively, the ALE growth process is carried out at a pressure from about 0.1 mbar to 30 mbar. Thence, the ALE apparatus must be pumped to the lower one of cited pressures for the load/unload steps. To speed up this phase the reactor is advantageously equipped with a separate pump specifically designed for this purpose. Such a pump can be of the turbomolecular pump or cryopump variety, for instance.

As the film may also grow inadvertently on other surfaces than those of the substrate, stabilization of the reactor chamber temperature contributes to reduced formation of contaminating particles released from the flaking of films grown on the reactor surfaces. In the practice of the art, the principal cause of flaking has been traced to the differences in the thermal expansion coefficients of the accumulated film and the material of the reactor chamber walls.

ALE will give rise to thin films of even thickness. It is, however possible further to reduce any variations in thickness of the thin films by rotating the substrates about their central axis. The rotation can be continuous or discontinuous. Continuous rotation can be implemented by rotating the substrate at a constant speed during the pulsing while preferably avoiding a rotational speed which would coincide with the pulsing frequency of the reactant feed which would lead to the pulses always entering the same sector of the substrates. Discontinuous rotation can be canned out by introducing a predetermined number of source chemical pulses, then stopping pulsing and turning the substrate about the central axis into a new position once the substrate is in motionless state, and then continuing pulsing. The rotation angle can be 1 to 359 degrees, preferably 90, 180 or 270 degrees. The substrate is rotated at least once during the deposition process. In both embodiments, it is preferred to make the substrate holder rotatable.

Rotation of the substrate provides for an increase of the growth rate on surface areas that otherwise would have a growth rate below the average rate on the substrate and, conversely, a decrease of the growth late on surface areas that have a growth rate above the average. The rotation method is beneficial for growth processes where the growth rate of a thin film is affected e.g. by the blocking of active surface sites with reaction by-products, such as HCl, HF and ammonium halides. This blocking is typical in the ALE process where acidic and basic components are present in the reaction chamber at the same time. In ALE of oxides the blcoking is observed in the growth of $Al_2O_3$ from $AlCl_3$ and $H_2O$ where HCl is formed as a reaction by-product. HCl that is acid reacts further with basic OH groups present on the surface of $Al_2O_3$. In the reaction the OH group is replaced with Cl that cannot be used as reactive site. $H_2O$ is formed as a reaction by-product. Since the basic OH groups are also the ones that are utilized in the metal compound reactions, non-uniform films are produced. In ALE of nitrides the blocking is observed in the TiN growth from $TiCl_4$ and $NH_3$ and in the growth $W_xN_y$ from $WF_6$ and $NH_3$. On the TiN and $W_xN_y$ surfaces, basic $NH_x$ groups are present which can interact very strongly with HCl and HF that arc formed in the reaction between $NH_x$ groups and $TiCl_4$ and $WF_6$, respectively. In the metal nitride reactions especially the reaction of HCl or HF with the $NH_2$ groups leads to the replacement of the NH₂ group with Cl or F. NH₃ is formed as a by-product.

The specific properties and benefits of the invention will be appreciated from the following detailed description in which reference is made to the appended drawings.

Figure 1:
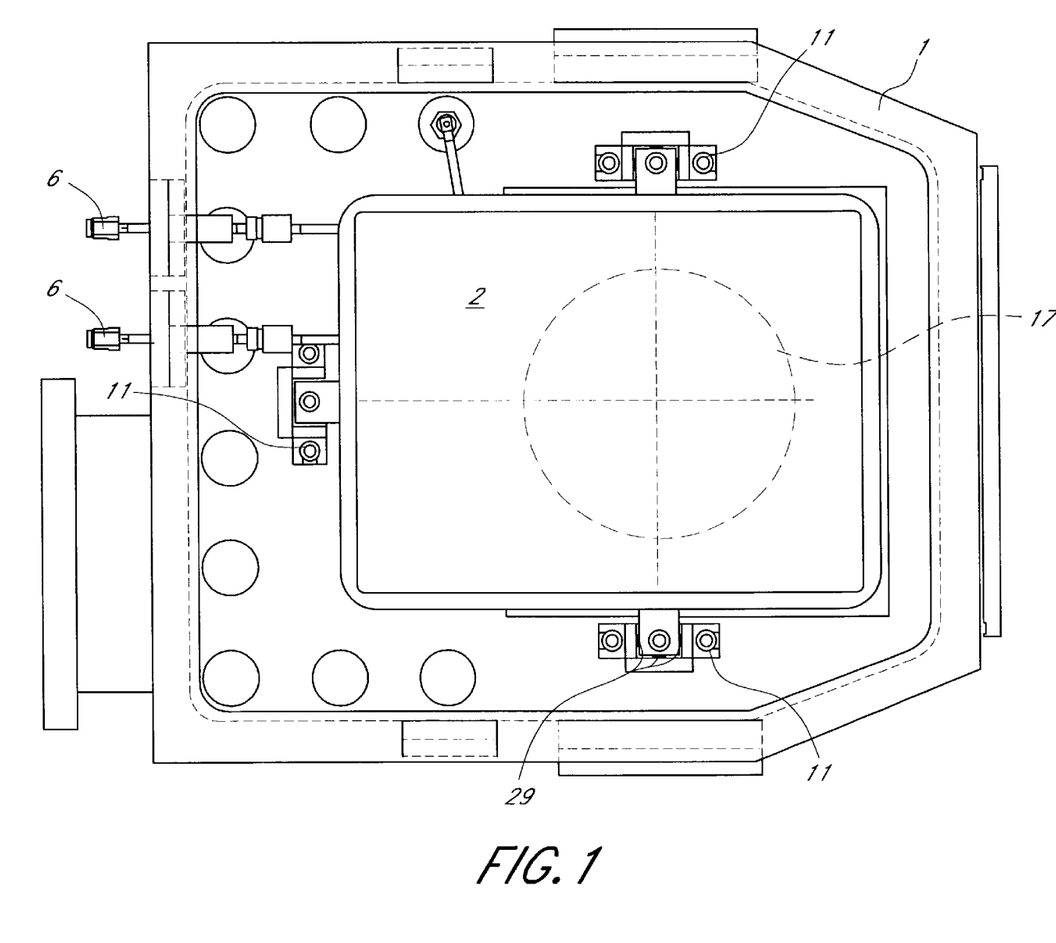
FIG. 1 shows a top view of an assembly diagram for a simplified construction of a reactor embodiment according to the invention.

In FIG. 1 is shown a top view of an apparatus according to the invention, wherein the vacuum vessel is denoted by reference numeral 1. The reactant inlet lines are denoted by reference numeral 6. In the interior of the vacuum vessel, there is adapted a reaction chamber 2. whose stationary base part (cf. later description) is mounted in the vacuum vessel on three supports. The circular contour of a substrate is outlined in the diagram in a dashed 17 line. The other dashed lines in the diagram outline the center axes of the support system passing via the center point of the substrate. As described earlier in the text, this kind of arrangement is capable of preventing the effect of thermal expansion movements on the substrate position during the closing of the cassette pack, whereby the movable part of the pack at all times will mate accurately with the stationary part thus ensuring the tightness of the reaction space.

Figure 2:
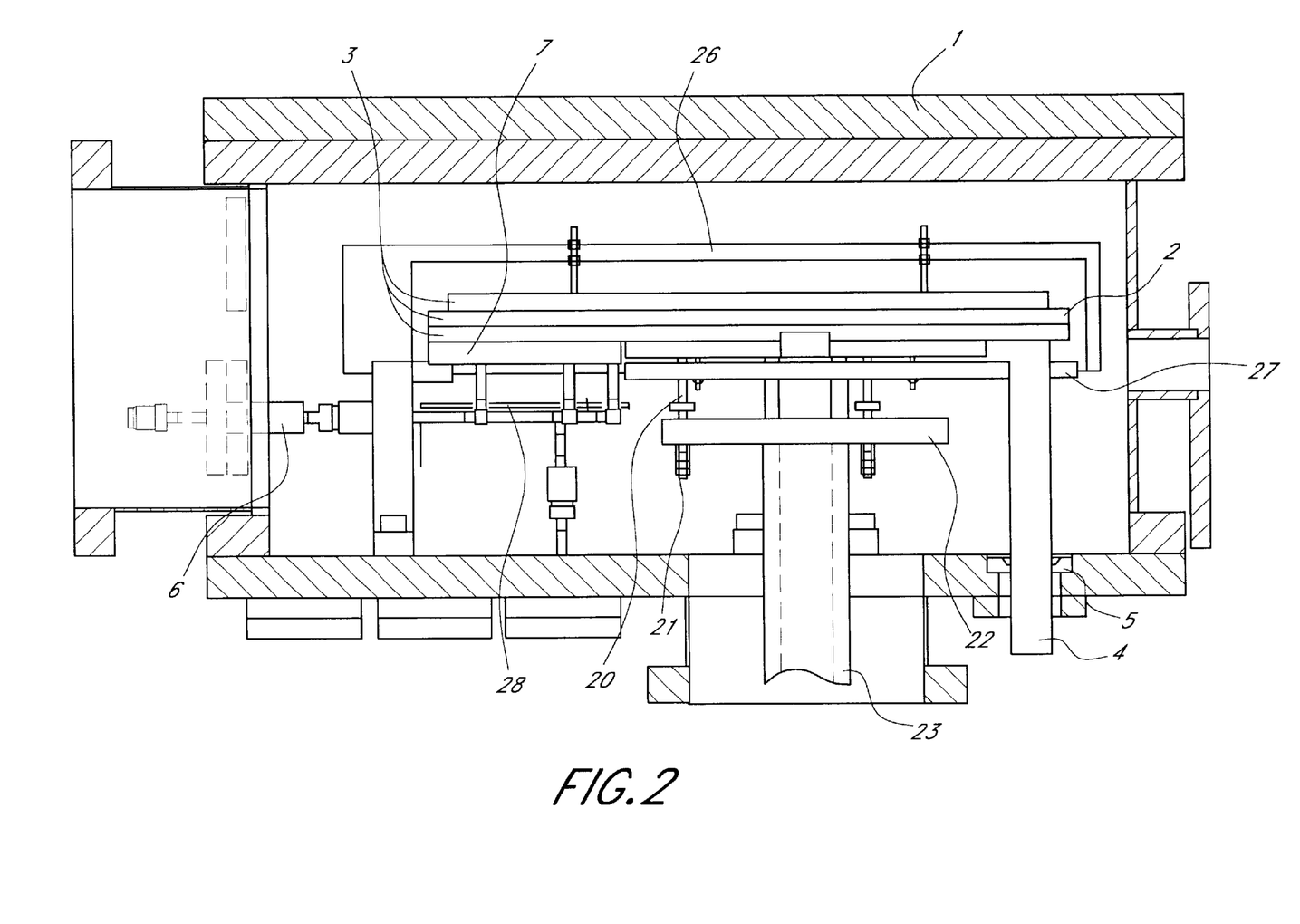
FIG. 2 shows a side view of the simplified construction of the reactor embodiment.
Figure 3:
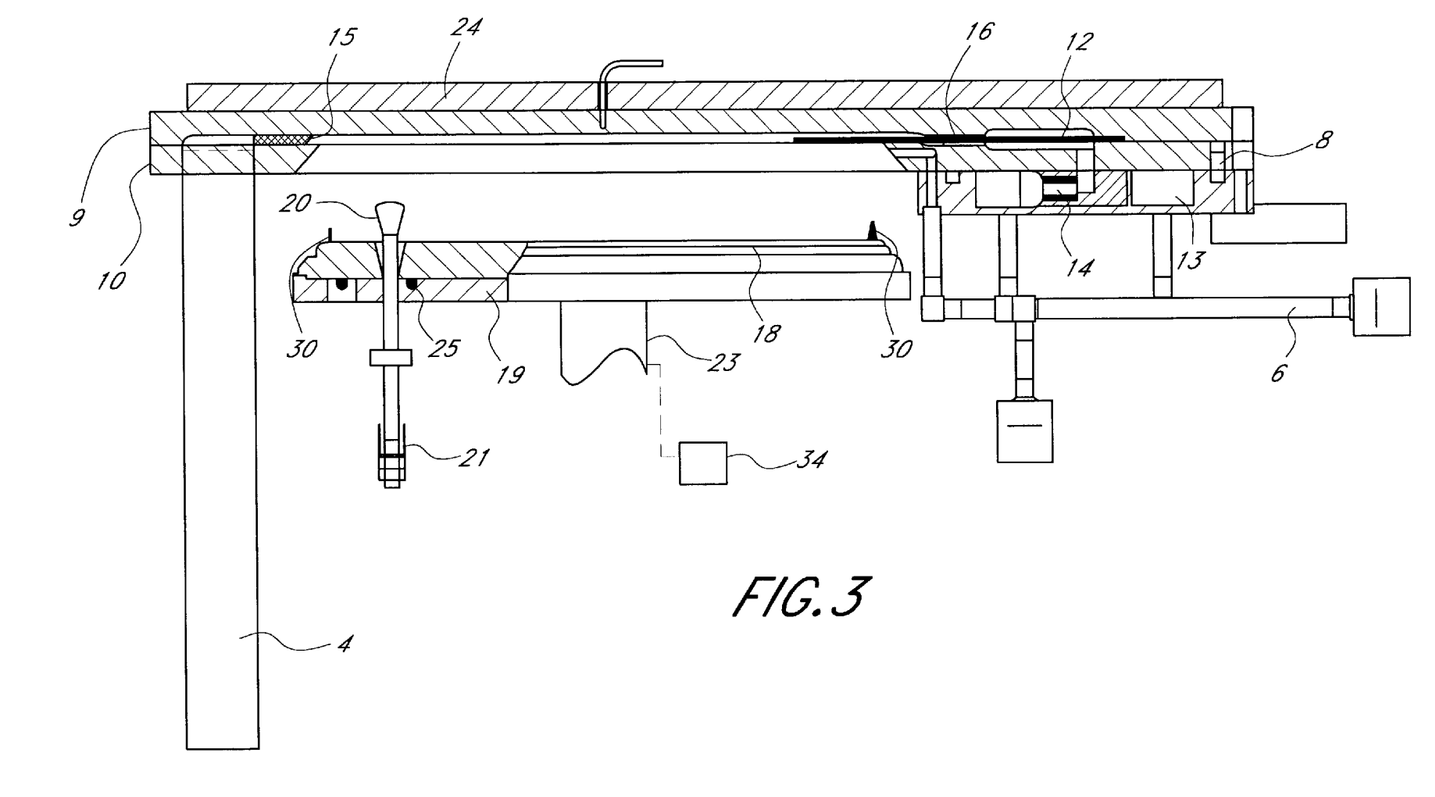
FIG. 3 shows an enlarged stectional side view of the simplified construction of the reactor embodiment.

In FIGS. 2 and 3 is shown a more detailed structure of the apparatus. As illustrated herein, the reaction chamber 2 adapted into the vacuum vessel 1 comprises a action space formed in a pack of superimposedly stacked planar elements 3. The set of planar elements 3 include a top plate 9, a base plate 10 and a heating plate 24 (cf. FIG. 3). Thin films can be grown in the reaction chamber onto a substrate using an ALE process. Reference numeral 4 denotes the connection of the reaction chamber to a line leading to the suction inlet of a vacuum pump, said line being sealed against leaks from the exterior of the reaction chamber by means of a seal 5. Respectively, reference numeral 6 denotes an inlet line of vapor-phase reactants, said line being connected to the reactant inlet distribution plate 7.

In FIG. 3 is shown the technique of forcing a looped vacuum pump-out groove 8 for sucking away any possible leaks. The vacuum pump-out groove is connected to a line 4 leading to the suction inlet of a vacuum pump. The function of the vacuum pump-out grooves is to prevent the access of contamination from the exterior of the reactor into the reaction space and, conversely, the reactants from escaping to the exterior side of the reaction space. Hence, it acts a kind of gaslight seal for the reactor.

As noted above, the sealing of the planar elements against each other can be implemented using elastomer seals. However, it is also possible to attain a sufficient degree of tightness using straight planar surfaces that act as the sealing seats between the planar elements.

The upper half of the reactor space forms the reactor chamber top plate 9 and, respectively, the lower half is comprised of the base plate 10. The base plate is mounted on supports 11. Between the top and the base plate there is adapted a divider plate 12 serving to isolate the reactant flows from each other. To the bottom side of the base plate is attached a reactant inflow distribution plate 7 in which the gas flows are divided into a linear front laterally over the reaction space. The reactant infeed and discharge lines 6, 4 and the reaction chamber 2 have a narrow cross section along their longitudinal axis and are elongated in order to achieve a "flattened" gas flow pattern and to minimize the side of the reaction space.

In the embodiment illustrated in FIG. 3, the vapor-phase reactant pulses of different reactant material groups are fed alternately into the infeed line 6. Prior to the infeed, the reactant concentrations are homogenized most appropriately by means of a protective gas flow in the infeed line 6 or even earlier. In the infeed line, each vapor-phase reactant pulse having a planar, flattened flow pattern propagates with a linear, blunt front. The width of the flow pattern is equal to that of the substrate platform which may be in the range of 5–50 cm, for instance.

The flow propagating in the infeed manifold is distributed into a homogeneous front by dimensioning the reaction space with its constrictions so that the conductance of the infeed channel 13 is much larger than the conductance through the capillary channels 14 in the interior of the reaction chamber 2, the flow is homogenized by virtue of a narrow suction slit 15 that acts as a gas flow constriction. In practical tests (performed with lean dosages), the gas flow front has been found to be very straight. Uniform suction over the lateral direction of the gas flow front is of primary importance, because gas molecules tend to travel in the direction of the lowest pressure (caused by the highest suction power), whereby the linear contour of the gas flow front will become distorted if it is subjected to an uneven suction. On the other hand, laterally uniform suction can even straighten a gas flow front which is warped due to some reason.

In the embodiment of FIG. 3, the gas flow is passed via constrictions that are located both at a point 16 before the substrates as well as at a point 15 after the substrates. This arrangement can assure an extremely homogeneous flow over the substrates.

The center axis of the reaction chamber support means is adapted to coincide with the center axis of the substrate 17. The support legs 11 are provided with adjustment screws 29 by means of which the position of the reactor chamber can be set and locked in respect to the vacuum vessel. This construction aims to keep the center of the substrate stationary and to direct the thermal expansion deformations radially outward from said center. It is essential that the substrate position is kept stationary in order to permit the use of robotic bandling (means, whereby the robotic arm can place the substrate accurately into its support niche.

In FIG. 3 is shown an apparatus embodiment in which the reaction chamber 2 can scalably admit a movable base plate 18 with its integral heating plate 19. In this embodiment, the movable base of the reaction chamber acts as the substrate holder. The movable part has a beveled edge contour that seals its edge against the reaction chamber edge. The beveled edge is provided with a groove or a number of grooves that can be used as nitrogen purging grooves, seal grooves or vacuum pump-out grooves. The edge of the base plate 18 may also have conical pins 30 that guide the positioning of the substrate on the base plate 18.

The elements of the substrate lift means 20 having a conical lower surface are sealed against the movable base plate by their conical shape, thus permitting the reaction space to be isolated from the exterior of the reaction chamber. During a process run, the conical pins 20 are withdrawn flush with the seat surface by means of springs 21. The conical pins 20 are fastened to a support plate 22 that can be transferred mechanically or by an actuator means via a transport rod 23.

In order to provide homogeneous distribution of the inlet reactant gas pulses, it is possible to adapt the base plate 18 for rotation during the reaction. This means that, in practice, also the substrate lift means 20 are made rotatable. For example, a schematically shown motor 34 may be provided for rotating the plate 18 by way of the rod 23.

The interior of the heating plates 19 and 24 can be equipped with a variety of different heater elements 25. The heating plates 19 and 24 are pressed against the plates of the reaction chamber thus assuring efficient heat transfer. The heating of the reaction chamber is augmented by locating reflective shields 26, 27, 28 about the stacked reaction space pack.

What is claimed is:

1. An apparatus for growing thin films on a substrate by exposing the substrate to alternate surface reactions of vapor-phase reactants, the apparatus comprising:
   a chamber defined by a plurality of walls, the chamber housing the substrate during processing, wherein the walls of the chamber are exposed to the reactants during processing;
   a base plate configured to hold the substrate during processing;
   a first heating element positioned to heat the base plate;
   a second heating element positioned to heat the walls of the chamber; and
   a plurality of shelf platforms for supporting a plurality of substrates within the chamber, the shelf platforms comprising heating means.

2. The apparatus of claim 1, wherein the first heating element is a resistance heating element.

3. The apparatus of claim 1, wherein the first heating element is embedded within a first heating plate.

4. The apparatus of claim 3, wherein the first heating plate is integral with the base plate.

5. The apparatus of claim 3, further comprising a plurality of heating elements within the first heating plate.

6. The apparatus of claim 3, wherein the second heating element is embedded within a second heating plate.

7. The apparatus of claim 6, further comprising a plurality of heating elements within the second heating plate.

8. The apparatus of claim 6, wherein the second heating plate is integral with a wall of the chamber.

9. The apparatus of claim 1, wherein the chamber is a reaction chamber housed within a separate vacuum vessel.

10. The apparatus of claim 9, wherein the internal temperature of the vacuum vessel can be controlled independently from the temperature of the reaction chamber.

11. The apparatus of claim 9, further comprising an insulation element positioned between the reaction chamber walls and wall of the vacuum vessel.

12. The apparatus of claim 11, wherein the insulation element comprises a reflective shield.

13. The apparatus of claim 11, wherein the insulation element comprises an active cooling element.

14. The apparatus of claim 13, wherein the active cooling element composes a coolant circulator.

15. The apparatus of claim 9, further comprising an active cooling system on walls of the vacuum vessel.

16. The apparatus of claim 1, wherein the base plate and the walls of the chamber are moveable relative to one another to facilitate substrate loading onto the base plate and unloading from the base plate.

17. The apparatus of claim 16, wherein the base plate is movable.

18. The apparatus of claim 17, wherein the base plate is movable in a direction parallel to a substrate plane.

19. The apparatus of claim 17, wherein the base plate is movable in a direction perpendicular to a substrate plane.

20. The apparatus of claim 19, wherein the base plate is additionally movable in a direction parallel to a substrate plane.

21. An apparatus for growing thin films onto a substrate by exposing the substrate to alternate surface reactions of vapor-phase reactants, the apparatus comprising:
   a vacuum vessel defined by a plurality of walls; and
   a reaction chamber defined by a plurality of walls that are exposed to reactants during processing, the reaction chamber positioned inside the vacuum vessel, the reaction chamber including
      a support configured to accommodate a substrate within the reaction chamber during processing,
      a first heater to heat the support, and
      a second heater to heat the walls of the reaction chamber that are exposed to reactants during processing.

22. The apparatus of claim 21, wherein the first heater is a first heating plate.

23. The apparatus of claim 22, wherein the first heating plate comprises a resistive heating element.

24. The apparatus of claim 22, wherein the second heater is a second heating plate.

25. The apparatus of claim 21, wherein the support is moveable to facilitate loading/unloading of substrates.

26. The apparatus of claim 21, further comprising cooling means on the walls defining the vacuum vessel.

27. The apparatus of claim 26, wherein the cooling means comprise reflective shields.

28. The apparatus of claim 26, wherein the cooling means comprise active cooling elements.

29. The apparatus of claim 28, wherein the active cooling elements are coolant circulators.

30. The apparatus of claim 21, wherein the vacuum vessel temperature can be controlled independently from the temperature of the reaction chamber.

31. An apparatus for growing thin films onto a substrate by exposing the substrate to alternate surface reactions of vapor-phase reactants, the apparatus comprising a reaction chamber including a plurality of walls and a base plate movable relative to the walls, the base plate configured to support the substrate within the reaction chamber during processing, the apparatus further comprising a first heater positioned to heat the base plate and a second heater positioned to heat the walls of the reaction chamber.

32. The apparatus of claim 31, further comprising a separate vacuum vessel surrounding the reaction chamber.

33. The apparatus of claim 32, wherein the vacuum vessel is adapted to have temperature control independent of the reaction chamber temperature control.

34. The apparatus of claim 32, wherein the reaction chamber walls are fixed relative to the vacuum vessel and the base plate is movable relative to the vacuum vessel.

35. The apparatus of claim 31, wherein relative movement between the base plate and the reaction chamber walls opens the reaction chamber for substrate loading/unloading.

36. The apparatus of claim 31, wherein each of the first and second heaters comprise resistive heating elements.

37. The apparatus of claim 36, wherein the first heater comprises a heating plate integral with the base plate.

38. The apparatus of claim 36, wherein the second heater comprises a heating plate pressed against the chamber walls.

39. An apparatus for growing thin films on a substrate by exposing the substrate to alternate surface reactions of vapor-phase reactants, the apparatus comprising:
   a chamber defined by a plurality of walls, the chamber housing the substrate during processing, wherein the walls of the chamber are exposed to the reactants during processing;
   a base plate configured to hold the substrate during processing;
   a first heating element positioned to heat the base plate; and a second heating element positioned to heat the walls of the chamber, wherein the base plate and the walls of the chamber are moveable relative to one another to facilitate substrate loading onto the base plate and unloading from the base plate.

40. The apparatus of claim 39, wherein the first heating element is a resistance heating element.

41. The apparatus of claim 39, wherein the first heating element is embedded within a first heating plate.

42. The apparatus of claim 41, wherein the first heating plate is integral with the base plate.

43. The apparatus of claim 41, further comprising a plurality of heating elements within the first heating plate.

44. The apparatus of claim 41, wherein the second heating element is embedded within a second heating plate.

45. The apparatus of claim 44, further comprising a plurality of heating elements within the second heating plate.

46. The apparatus of claim 44, wherein the second heating plate is integral with a wall of the chamber.

47. The apparatus of claim 39, wherein the chamber is a reaction chamber housed within a separate vacuum vessel.

48. The apparatus of claim 47, wherein the internal temperature of the vacuum vessel can be controlled independently from the temperature of the reaction chamber.

49. The apparatus of claim 47, further comprising an insulation element positioned between the reaction chamber walls and wall of the vacuum vessel.

50. The apparatus of claim 49, wherein the insulation element comprises a reflective shield.

51. The apparatus of claim 49, wherein the insulation element comprises an active cooling element.

52. The apparatus of claim 51, wherein the active cooling element comprises a coolant circulator.

53. The apparatus of claim 47, further comprising an active cooling system on walls of the vacuum vessel.

54. The apparatus of claim 53, wherein the base plate is movable.

55. The apparatus of claim 54, wherein the base plate is movable in a direction parallel to a substrate plane.

56. The apparatus of claim 54, wherein the base plate is movable in a direction perpendicular to a substrate plane.

57. The apparatus of claim 56, wherein the base plate is additionally movable in a direction parallel to a substrate plane.

58. An apparatus for growing thin films on a substrate by exposing the substrate to alternate surface reactions of vapor-phase reactants, the apparatus comprising:
a reaction chamber defined by a plurality of walls, the chamber housing the substrate during processing, wherein the walls of the chamber are exposed to the reactants during processing and the reaction chamber is housed within a separate vacuum vessel;
a base plate configured to hold the substrate during processing;
a first heating element positioned to heat the base plate; and
a second heating element positioned to heat the walls of the chamber.

59. The apparatus of claim 58, wherein the first heating element is a resistance heating element.

60. The apparatus of claim 58, wherein the first heating element is embedded within a first heating plate.

61. The apparatus of claim 60, wherein the first heating plate is integral with the base plate.

62. The apparatus of claim 60, further comprising a plurality of heating elements within the first heating plate.

63. The apparatus of claim 60, wherein the second heating element is embedded within a second heating plate.

64. The apparatus of claim 63, further comprising a plurality of heating elements within the second heating plate.

65. The apparatus of claim 63, wherein the second heating plate is integral with a wall of the chamber.

66. The apparatus of claim 58, wherein the internal temperature of the vacuum vessel can be controlled independently from the temperature of the reaction chamber.

67. The apparatus of claim 58, further comprising an insulation element positioned between the reaction chamber walls and wall of the vacuum vessel.

68. The apparatus of claim 67, wherein the insulation element comprises a reflective shield.

69. The apparatus of claim 67, wherein the insulation element comprises an active cooling element.

70. The apparatus of claim 69, wherein the active cooling element comprises a coolant circulator.

71. The apparatus of claim 58, further comprising an active cooling system on walls of the vacuum vessel.

72. The apparatus of claim 58, wherein the base plate is movable.

73. The apparatus of claim 72, wherein the base plate is movable in a direction parallel to a substrate plane.

74. The apparatus of claim 72, wherein the base plate is movable in a direction perpendicular to a substrate plane.

75. The apparatus of claim 74, wherein the base plate is additionally movable in a direction parallel to a substrate plane.

* * * * *